United States Patent [19]
Maier

[11] 3,903,487
[45] Sept. 2, 1975

[54] MULTI-CIRCUIT SELECTION FILTER FOR TWO DIFFERENT FREQUENCY RANGES

[75] Inventor: Gerhard Maier, Schwenningen, Germany

[73] Assignee: GTE International, Stamford, Conn.

[22] Filed: May 1, 1974

[21] Appl. No.: 465,858

[52] U.S. Cl. .................. 333/77; 325/458; 325/462; 334/15; 334/60

[51] Int. Cl.[2] ........................ H03H 7/08; H03H 5/00

[58] Field of Search ............. 333/7 D, 70 R, 77, 76; 307/320, 317; 334/15, 59, 60; 325/452, 458, 459, 462, 464, 465

[56] References Cited

UNITED STATES PATENTS

| | | | |
|---|---|---|---|
| 3,391,347 | 7/1968 | Bosse et al. | 307/320 X |
| 3,500,265 | 3/1970 | Klettke | 334/15 |
| 3,528,044 | 9/1970 | Manicki | 307/320 X |
| 3,559,075 | 1/1971 | Okazaki | 307/320 X |
| 3,611,154 | 10/1971 | Kupfer | 334/15 X |

*Primary Examiner*—James W. Lawrence
*Assistant Examiner*—Marvin Nussbaum
*Attorney, Agent, or Firm*—Theodore C. Jay, Jr.; Robert T. Orner; Thomas H. Buffton

[57] ABSTRACT

A multi-circuit selection filter for two different frequency ranges includes series-connected primary and secondary windings for the two frequency ranges with a diode connected for selective short-circuitry of the primary winding for the low frequency range filter in accordance with a switching means.

5 Claims, 1 Drawing Figure

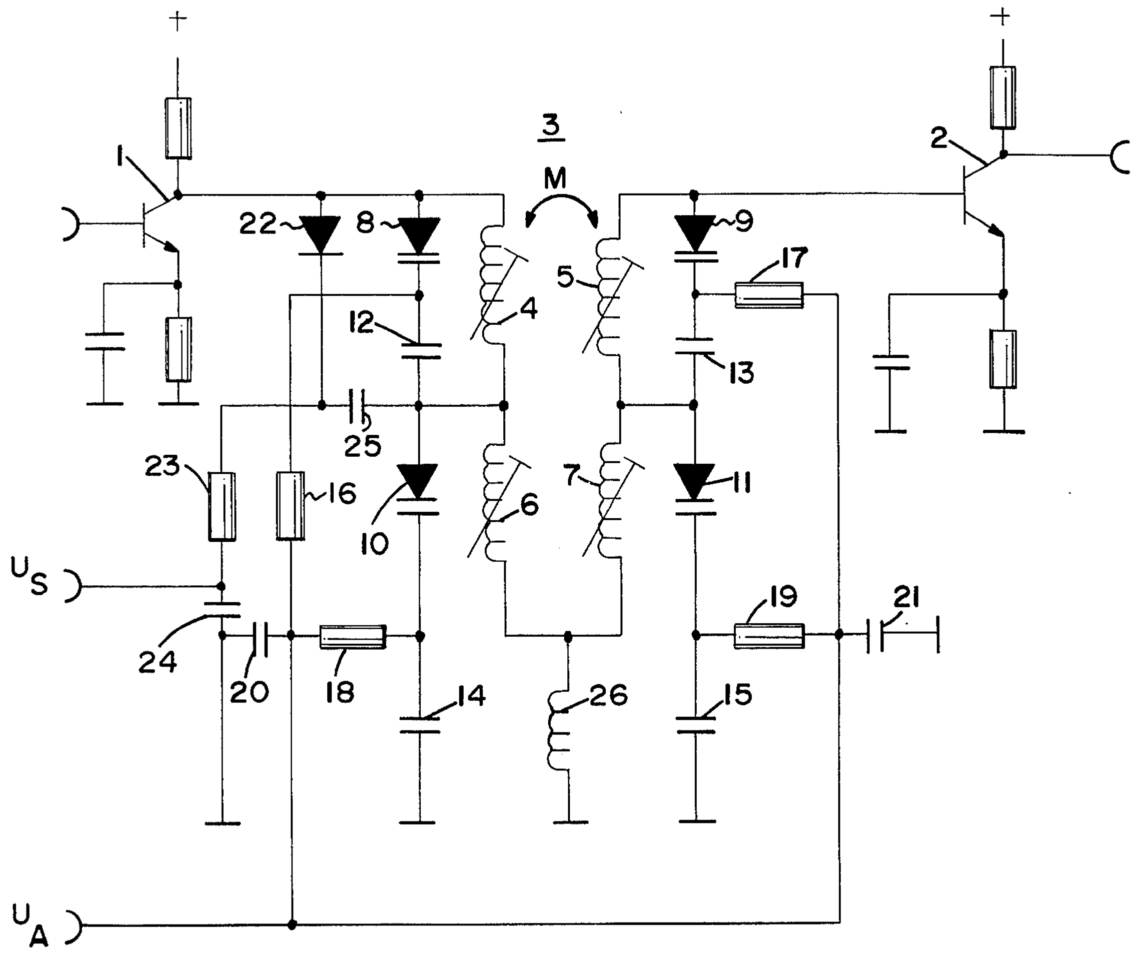
+
+
1
2
3
M
22
8
9
17
12
4
5
13
25
23
16
10
6
7
11
U_S
24
20
18
14
26
15
19
21
U_A

MULTI-CIRCUIT SELECTION FILTER FOR TWO DIFFERENT FREQUENCY RANGES

BACKGROUND OF THE INVENTION

The invention concerns a multi-circuit selection filter for two different frequency ranges, especially for television. Such selection filters are disposed between preamplifier and mixer stages and may be tuned by means of variable capacitors or capacity diodes. In this manner the receiving frequencies in band I, usually channels 2–4 having center frequencies of about 51 to 65 mHz, or band III, channels 5–12 having a center frequency of about 178–227 mHz, are filtered out.

It is known to effect the switch-over of the individual circuits for a desired frequency band by means of switch diodes. The coils for band I and band III are so apportioned that the band III coil forms part of the band I coil and that in the band III operation the band I coils are short circuited by the switching diodes. The band III circuit consists of a series connected tuning diode and padding capacitor and a switching diode connected in parallel to the band III coil. Herein, the switch diode is disposed with its finite forward resistance in the selection circuit whereby the losses increase very much just in the higher frequency range and, thus, the circuit qualities are deteriorated considerably.

These poor circuit qualities reduce the image frequency rejection and adjacent channel selectivity so that ambiguities and interferences result. This means that large cuts have to be made with respect to image frequency rejection and large signal behavior in band III as compared to band I.

Known circuitry for eliminating the disadvantageous effects of filtering out the received signal of bands I and III at the antenna input include selection circuits for feeding these signals to separate high frequency amplifiers in order to pass them to a mixer stage common to both frequency bands (Offenlegungsschrift 1,791,255, "Valvo-Mitteilungen" April 1972). This solution is very good as regards selection since the circuit qualities are excellent in both the selection circuits. However, it exhibits the great disadvantages that an additional high frequency stage is required to attain the decoupling of the signals from the antenna input up to the mixer stage. This leads to a considerable deterioration, intermodulation distortions, and cross modulation behavior at the common connection at the mixer input because the band I signals and the band III signals arrive at the mixer in an amplified way.

Furthermore, it is possible to use separate selection stages for band I and band III with the stages connected in parallel and decoupled from one another by switch diodes at the input and output. The decoupling via the switch diodes is disadvantageous, however, in that it cannot be complete because of the capacity associated with the switch diodes in the cut-off condition.

Moreover, a tuning device for high-frequency oscillations is known (German Auslegeschrift 1,297,171) wherein switch diodes are used to switch over from the UHF range to the VHF range. This Auslegeschrift is based on the problem of obtaining a simple preselection with minor expenditure of material and small control current requirements. In this circuitry the required switch diodes are likewise disposed in the selection circuits so that the forward resistances have a negative influence on the circuit qualities.

Besides, a known circuit arrangement for tuning (German Auslegeschrift 1,591,364) employs capacity diodes in resonance circuits. In this circuitry the resonance circuits for the various frequency ranges are disposed in parallel. The resonance circuits not desired in the respective case are stagger-tuned to a fixed value outside the normal tuning range. Resonance frequency and impedance of the undesired selection are deteriorated thereby.

On account of the parallel coupling of the circuits via capacitors, the parallel capacity increases disadvantageously and thus, the frequency variation range decreases. In order to obtain a better decoupling of the non-required circuits with respect to the resonance circuit tuned in each case to the desired receiving frequency, it is suggested in the known circuitry to provide the resonance circuit for the higher frequency range with a tapping. Those parts of the of the resonance circuit formed by the tapping together with the coupling capacitors between the resonance circuits and the amplifier member as well as the amplifier capacity effectively in parallel with the series-connection of the coupling capacitor and the resonance circuit form a bridge which is approximately balanced in the higher frequency range. This, however, conditions a defined position of the tapping point as well as most narrow tolerances of the structural members because the bridge is not adjusted. Thus, such known circuitry would hardly appear suited to mass production.

OBJECTS AND SUMMARY OF THE INVENTION

An object of the present invention is to provide an enhanced multi-circuit selection filter for two different frequency ranges. Another object of the invention is to provide an improved multi-circuit selection filter wherein band selection circuits are not influenced by switch diodes or other switching means. Still another object of the invention is to provide selection circuits for two frequency bands which are optimally decoupled. A further object of the invention is to effect substantially constant decoupling of a selected signal over the entire frequency range because of small insertion attenuation is attained.

These, and other and further objects, advantages and capabilities are achieved in one aspect of the invention by a multi-circuit selection filter for two different frequency ranges wherein series-connected primary and secondary windings have a diode for selective short-circuiting of the primary winding of one of the frequency range filters in accordance with a switching means.

BRIEF DESCRIPTION OF THE DRAWINGS

The sole FIGURE is a schematic illustration of a preferred embodiment of the invention suitable for employment in a television receiver.

DESCRIPTION OF THE PREFERRED EMBODIMENT

For a better understanding of the present invention, together with other and further objects, advantages and capabilities thereof, reference is made to the following disclosure and appended claims in conjunction with the accompanying drawing.

In the drawing, a multi-circuit selection filter 3 for frequency bands I and III is connected between a high frequency preamplifier stage 1 and a mixer stage 2 of a television receiver. The selection filter 3 includes series-connected primary coils 4 and 6 and secondary coils 5 and 7. The primary coils, 4,6 and the secondary coils 5,7 respectively, are coupled together in pairs, i.e. 4,5 and 6,7.

In the embodiment described here, coils 4 and 5 are provided for the frequencies of band I or low band of frequencies and coils 6 and 7 for the frequencies of band III or high band of frequencies. The coils, together with the tuning components represented here as capacity diodes, 8,9, 10, and 11, form the selection circuits. Of course variable capacitors may also be provided for tuning.

The tuning capacity diodes 8,9,10, and 11 are arranged in series with padding capacitors 12,13,14, and 15 and in parallel with the respective coils 4,5,6, and 7. The required tuning voltage $U_A$ is supplied to the capacity diodes 8,9,10, and 11 via resistors 16,17,18, and 19. Capacitor 20 and 21 serve to keep off the tuning voltage $U_A$.

In parallel with the primary circuit for band I is a switch diode 22 which may be acted upon, via resistor 23, by a switching voltage $U_S$ which is kept off by a capacitor 24. A capacitor 25 serves to keep the DC switching voltage from the coils 6 and 26 as well as from the capacity diode 10. The circuits for the frequency range of band I are inductively coupled via the mutual inductance M while those of band III are coupled at the base point via coil 26.

Upon receipt of signals in the frequency range of band III, the switch diode 22 is turned on so that frequencies of band I can no longer be transferred via the mutual inductance M of coils 4 and 5. When the diode 22 is turned on, only the frequencies of band III are still transferred via the base-point coupling coil 26. Thus, the switch diode 22 does not enter the circuit as loss resistance and, therefore, does not deteriorate the circuit quality.

Due to the coupling and conductivity of the diode 22, the circuit for band III lies directly at the output of the preamplifier stage 1. Since the decoupling capacity in operation on band III is automatically varied via the tuning voltage $U_A$ the decoupling of the selection stage is constant over the entire frequency range. Thus, the decoupling of the signal need not be switched over as was previously conventional.

Also, with a lower tuning voltage $U_A$, i.e. with a lower receiving frequency, the series-connected capacity diode 9 and padding capacitor 13 of the secondary circuit 5 (band I) which is utilized for decoupling represents a large resulting capacity. However, with a higher tuning voltage $U_A$, which corresponds to a higher receiving frequency, the capacity-diode 9 forms a small capacity with the series-connected padding capacitor 13 so that the decoupling of the mixer stage remains substantially constant for band III.

Additionally, an advantage of the recited circuit arrangement is that the secondary circuit, secondary coil 5, diode-capacitor 9, and capacitor 13 of the selection filter, become automatically active as a suppression filter for signals from the lower frequency range (band I) upon receipt of signals in the higher frequency range (band III).

While there has been shown and described what is at present considered the preferred embodiment of the invention, it will be obvious to those skilled in the art that various changes and modifications may be made therein without departing from the invention as defined by the appended claims.

What is claimed is:

1. In a television receiver having preamplifier and mixer stages, a multi-circuit selection filter for two different frequency ranges interconnecting said preamplifier and mixer stages comprising:

mutually coupled primary and secondary circuits connected to said preamplifier and mixer stages and tunable to an upper frequency range;

mutually coupled primary and secondary circuits series connected to said primary and secondary circuits tunable to an upper frequency range, said primary and secondary circuits tunable to a lower frequency range;

an inductor coupling said series connected primary and secondary circuits tunable to a lower frequency range to circuit ground;

a source of switching voltage;

a diode shunting said primary circuit of said mutually coupled primary and secondary circuits tunable to an upper frequency range and to said source of switching voltage whereby said diode short circuits said primary circuit tunable to an upper frequency range and connects said primary circuit tunable to a lower frequency range to said preamplifier stage in response to a potential from said switching voltage source.

2. The multi-circuit selection filter for two different frequency ranges of claim 1 wherein a capacity diode effects tuning of each of said primary and secondary circuits.

3. The multi-circuit selection filter for two different frequency ranges of claim 1 wherein a variable capacitor effects tuning of each of said primary and secondary circuits.

4. The multi-circuit selection filter for two different frequency ranges of claim 1 wherein a series connected capacitor and capacity diode in said secondary circuit tunable to said lower frequency range decouples a signal of said upper frequency range from said mixer stage.

5. The multi-circuit selection filter for two different frequency ranges of claim 1 wherein said secondary circuit of said filter tunable to said lower frequency range serves as a suppression filter upon receipt of signals in said upper frequency range.

* * * * *